United States Patent
Pagkaliwangan et al.

(10) Patent No.: US 8,138,593 B2
(45) Date of Patent: Mar. 20, 2012

(54) PACKAGED MICROCHIP WITH SPACER FOR MITIGATING ELECTRICAL LEAKAGE BETWEEN COMPONENTS

(75) Inventors: Angelo Pagkaliwangan, Billerica, MA (US); Garry Griffin, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 488 days.

(21) Appl. No.: 12/255,012

(22) Filed: Oct. 21, 2008

(65) Prior Publication Data
US 2009/0102034 A1   Apr. 23, 2009

Related U.S. Application Data

(60) Provisional application No. 60/981,586, filed on Oct. 22, 2007.

(51) Int. Cl.
*H01L 23/02* (2006.01)
(52) U.S. Cl. ......... 257/685; 257/676; 257/E25.005; 257/E25.012; 257/E25.016; 257/E25.02; 257/E25.026; 257/E23.169; 438/110; 438/111; 438/123
(58) Field of Classification Search .......... 257/723, 257/E25.005, E25.012, E25.015, E25.016, 257/E25.02, E25.023, E25.026, 675, 685, 257/724, E29.28, E25.03, E23.052, E23.169, 257/676, 686; 438/110, 111, 123, FOR. 365, 438/FOR. 366, FOR. 380
See application file for complete search history.

(56) References Cited

U.S. PATENT DOCUMENTS

| | | | |
|---|---|---|---|
| 5,049,977 A * | 9/1991 | Sako | 257/676 |
| 5,739,582 A | 4/1998 | ElHatem et al. | 257/676 |
| 6,943,061 B1 | 9/2005 | Sirinorakul et al. | 438/113 |
| 7,064,442 B1 | 6/2006 | Lane et al. | 257/773 |
| 2002/0163040 A1 | 11/2002 | Kinzer et al. | 257/341 |
| 2004/0222503 A1* | 11/2004 | Lee et al. | 257/678 |
| 2007/0023751 A1 | 2/2007 | Shoji | 257/59 |
| 2008/0179963 A1 | 7/2008 | Fouquet et al. | 307/104 |

FOREIGN PATENT DOCUMENTS

JP   10-147755   * 6/1998
JP   11 054787     2/1999

OTHER PUBLICATIONS

Patent Abstracts of Japan, Jul. 30, 1997, 1 page—JP 11054787 (Matsushita Electric Works Ltd., Feb. 26, 1999).
Authorized Officer Peter Zeisler, The International Search Report and the Written Opinion of the International Searching Authority, International Application No. PCT/US2008/080605, International Searching Authority, Apr. 14, 2009, 14 pages.

* cited by examiner

*Primary Examiner* — Jasmine Clark
(74) *Attorney, Agent, or Firm* — Sunstein Kann Murphy & Timbers LLP

(57) ABSTRACT

A packaged microchip has a base, at least one spacer coupled to the base, and first and second microchips mounted to the at least one spacer. The at least one spacer is configured to substantially prevent leakage current between the first and second microchips.

24 Claims, 3 Drawing Sheets

PACKAGED MICROCHIP WITH SPACER FOR MITIGATING ELECTRICAL LEAKAGE BETWEEN COMPONENTS

CROSS-REFERENCE TO RELATED APPLICATIONS

This patent application claims priority to U.S. Provisional Patent Application No. 60/981,586 filed Oct. 22, 2007, entitled PACKAGED MICROCHIP WITH SPACER FOR MITIGATING ELECTRICAL LEAKAGE BETWEEN COMPONENTS, the disclosure of which is incorporated by reference herein in its entirety.

FIELD OF THE INVENTION

The invention generally relates to packaged microchips and, more particularly, the invention relates to substantially mitigating leakage between two or more chips in a single package.

BACKGROUND OF THE INVENTION

Lead frame packaging is a well known methodology for packaging microchips. Lead frames are generally etched or stamped from a metal, such as copper, to form the lead frame. The lead frame typically includes a plurality of leads ("legs") to be used for input and output of one or more microchips along with a platform for attaching one or more microchips. The platform is generally conductive and referred to as a paddle or die pad. Microchips are attached to the paddle using a die attach material. Die attach material has an uncontrolled thickness. The die attach material is applied to the paddle in a liquid state and the microchips are pressed into the liquid die attach. The die attach spreads on the paddle in a non-uniform manner during placement of the microchips. The die attach material is then cured into a solid form. During curing, from a liquid to a solid phase, the die attach material hardens and is prone to developing voids due to trapped air bubbles. The microchips are then wire bonded to the leads and sometimes also wire bonded to each other prior to encapsulation with an insulative material, such as plastic molding compound.

Problems with lead frame design can arise, however, when unintended currents leak between two adjacent microchips along the platform supporting the microchips. Since the die attach material is non-uniform in thickness and may develop voids due to air bubbles during curing, the die attach material has non-uniform isolation properties. Two adjacent microchips on a single die paddle may leak current onto the die paddle due to the non-uniform nature of the die attach material. Undesirably, leakage currents may adversely affect the microchips and the overall device functionality and reliability. For example, a first microchip may produce a leakage current that is received by a second, adjacent microchip. This problem is exasperated by microchips employing large voltage potentials (e.g. 100s to 1000s of volts). With large voltage potentials, arching between microchips may occur even if the microchips are spatially separated.

The art has responded to these problems by providing split (i.e., multiple), properly spaced electrically isolated die paddles. Accordingly, one microchip couples with one die paddle while the other microchip couples with the other die paddle. In fact, to accommodate more than two microchips, some packages have more than two paddles. Chip package designers isolate the chips by separating the chips by a gap and providing a mold material that forms around the microchips with a sufficient dielectric insulation capacity to isolate the two or more microchips.

Although generally effective at substantially mitigating/eliminating leakage current problems, split paddles are more complicated to produce and thus, more costly. For example, many applications provide split paddles as a custom engineering solution, thus increasing production costs. Split paddle designs require a custom etching for the lead frame or a specialized stamp. If the microchips change, for example, to a larger microchip, the paddle design must also be changed.

SUMMARY OF THE INVENTION

In accordance with one embodiment of the invention, a packaged microchip has a base, at least one spacer coupled to the base, and first and second microchips mounted to the at least one spacer. The at least one spacer is configured to substantially prevent leakage current between the first and second microchips. In embodiments of the invention, the spacer is a polyimide tape.

The base may be part of any of a variety of different package types, such as a premolded leadframe package or a postmolded leadframe package or any other packages with conductive die paddle or platform. In those embodiments, the base may have a die attach paddle to which the at least one spacer is coupled. To provide its function of substantially preventing leakage current, the at least one spacer may be formed from an insulative material that has a substantially uniform thickness. The spacer is sized so that large voltage differentials will not cause leakage currents between microchips. Among other ways, a single spacer may couple with both the first and second microchips, or a first spacer couples with the first microchip, and a second spacer couples with the second microchip or a first spacer couples with the first microchip and the second microchip couples directly to the die paddle. When two spacers are used, the first spacer may be spaced from the second spacer (although such spacing is not always necessary). The distance that the spacers are set apart separates the microchips and can prevent current arcing. Spacing between the microchips themselves also can be important to enable the encapsulating material to be deposited between them, thus providing additional isolation or protection from current leakages.

Some embodiments of the packaged microchip also include a first electrical interface and a second electrical interface. The first electrical interface is directly electrically connected with the first microchip, while the second electrical interface is directly electrically connected with the second microchip. In addition, in those embodiments, the first microchip may directly electrically connect with the second microchip, while the second microchip electrically isolates the first interface from the second interface. Among other things, the second microchip may be a transformer or other electrically isolating device.

The at least one spacer illustratively is formed from an insulative material, such as a polyimide or other film. For example, the at least one spacer may be formed from a dielectric having a thickness of less than about 0.003 inches. As a further example, the at least one spacer may have a dielectric strength of between about 3 KV/thousandths of an inch to 6 KV/thousandths of an inch.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, an insulative spacer substantially eliminates leakage currents between microchips within a package. Accordingly, use of the spacer should eliminate the need for complicated and expensive split paddle designs, or other schemes for mitigating leakage currents. Details of illustrative embodiments are discussed below.

Figure 1:
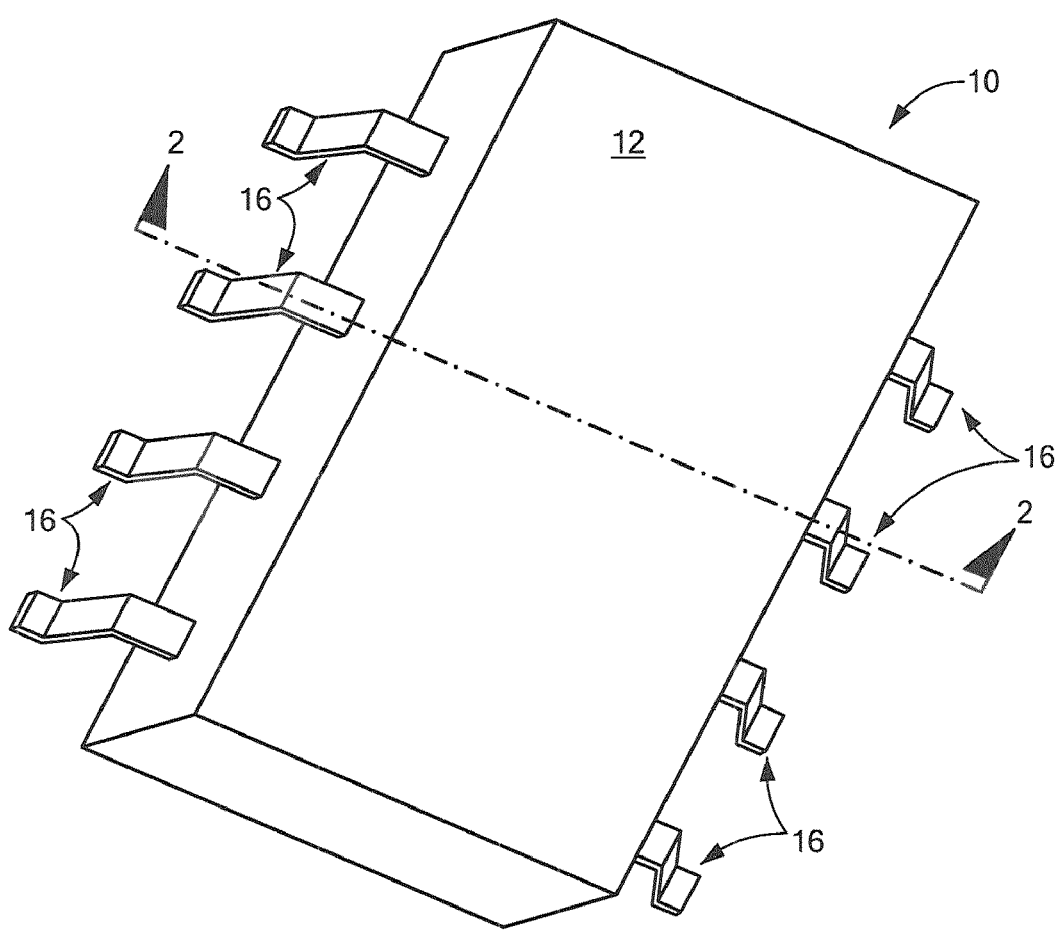
FIG. 1 schematically shows a perspective view of a packaged microchip that may be configured in accordance with illustrative embodiments of the invention.

FIG. 1 schematically shows a perspective view of a packaged microchip 10 that may be configured in accordance with illustrative embodiments of the invention. The packaged microchip 10 shown has a postmolded leadframe package 12, commonly referred to as a "plastic package," containing a plurality of microchips 14A and 14B (not shown in FIG. 1, but shown in FIGS. 2 and 3). The microchips 14A and 14B electrically communicate with exterior components by means of eight pins/leads 16 extending from the package 12. In one embodiment, one of the microchips may be an isolation circuit that provides electrical isolation against stray currents.

It should be noted that discussion of a postmolded leadframe package 12 is for illustrative purposes only and thus, not intended to limit all embodiments. For example, some embodiments may apply to premolded leadframe packages. In fact, various embodiments also may apply to ceramic packages, substrate packages, carrier packages, or a variety of other package types.

Figure 2:
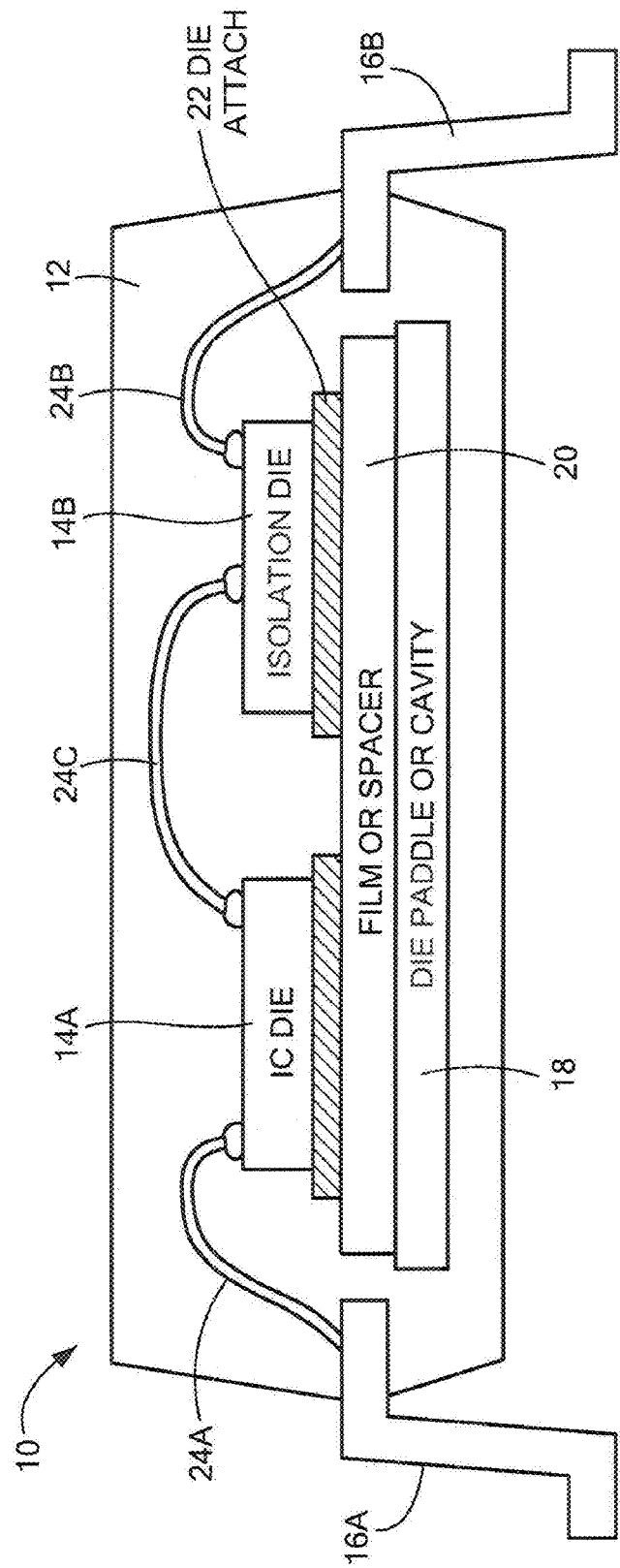
FIG. 2 schematically shows a cross-sectional view of the microchip of FIG. 1 along line 2-2 when configured in accordance with illustrative embodiments of the invention.
Figure 3:
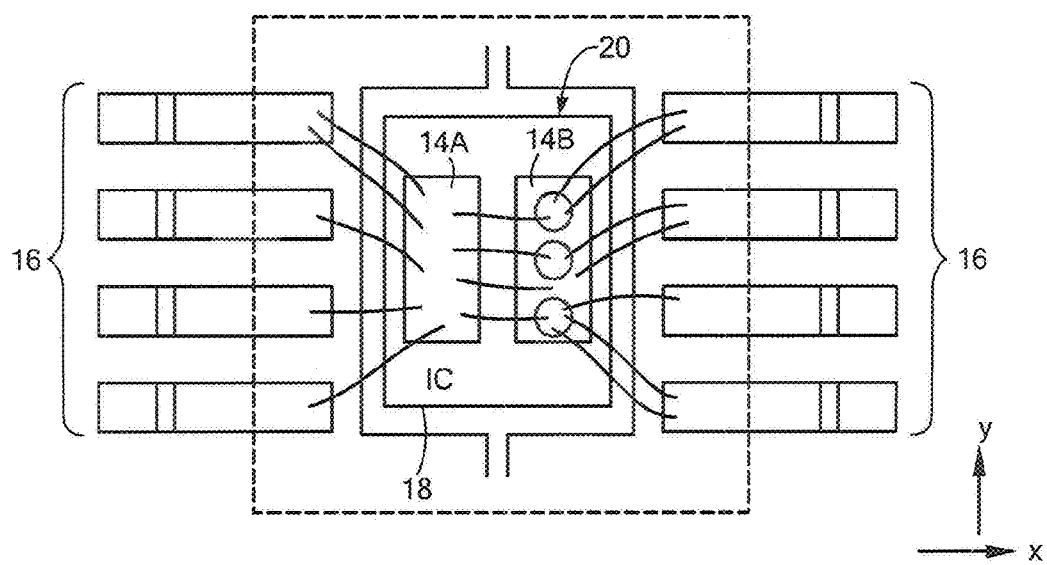
FIG. 3 schematically shows a top view of the microchip shown in FIG. 1 before encapsulation (step 404 of the process shown in FIG. 4).

FIG. 2 schematically shows a cross-sectional view of the packaged microchip 10 shown in FIG. 1 along cross-line 2-2. To illustrate further details, FIG. 3 schematically shows a top view of the packaged microchip 10 without encapsulation material. Specifically, as shown, the packaged microchip 10 has a leadframe forming a single die paddle 18 and eight leads 16. Of course, discussion of eight leads 16 is for illustrative purposes only. The leadframe preferably is formed from a metal, such as copper, and etched, cut, or stamped in a specific manner to form the die paddle 18 and leads 16. Moreover, rather than use leads 16, some embodiments use other types of electrical interfaces, such as ball grid arrays or pads used in surface mounting applications.

In accordance with illustrative embodiments of the invention, the packaged microchip 10 also has a spacer 20 securing two microchips 14A and 14B to the leadframe. To that end, an adhesive secures the spacer 20 to the die paddle 18, while conventional non-conductive die attach material 22 secures the microchips 14A and 14B to the spacer 20. In some embodiments, the spacer 20 has adhesive integrated into its top surface to secure the microchips 14A and 14B. In that embodiment, the die attach material 22 is not necessary. The spacer may be a polyimide film. For example, the spacer may be Kapton® tape produced by DuPont. The spacer is preferably not formed solely from a non-conductive epoxy, since non-conductive die attach material is subject to erosion from moisture, temperature, and heat. Additionally, migration of silver from any silver-plated portions of the paddle may occur, thereby making film a more attractive solution than a non-conductive die attach material.

As shown, a first of the microchips (identified by reference number 14A and referred to in the figure as "IC die 14A") connects with a first lead 16A by means of a wirebond 24A, while a second of the microchips, (identified by reference number 14B and referred to in the figure as "isolation die 14B") connects with a second lead 16B by means of another wirebond 24B. To provide intended electrical communication between the two microchips 14A and 14B, a third wirebond 24C electrically connects the isolation die 14B with the IC die 14A.

In some embodiments, the isolation die 14B is an electrical isolation device. For example, the isolation die 14B may be a transformer or other electrically isolating device that electrically isolates portions of a circuit while transmitting a signal. In one embodiment, the isolation die includes an optical system that transforms an electrical signal into an optical output and thus, provides isolation between the input and the output of the isolation die. An isolation die could be used to separate a user interface from a high voltage system. Thus, the isolation die would separate the input 16A from the output 16B of the isolation device wherein a user interface, such as a medical monitoring device coupled to a patient is connected to the output 16B and a high-voltage computer system is connected to the input 16A. Accordingly, in such embodiments, a signal may be transmitted from the first lead 16A to the second lead 16B, while the isolation die 14B electrically isolates the two leads 16A and 16B; in other words, the isolation die 14B does not provide a direct path for current to flow between the two leads 16A and 16B. As a result, a voltage surge that results in current being fed through the lead 16B does not reach lead 16A and shock the patient coupled to the medical system.

In some implementations, the potential difference between the two leads 16A and 16B can be very high, such as on the order of 2,000 to 6,000 volts. Unintended current leakage between the two microchips 14A and 14B therefore can have catastrophic effects, such as destroying the microchips 14A and 14B, adjunct circuitry or, even worse, electrocuting someone. Accordingly, the spacer 20 is formed from material that substantially electrically isolates the bottom faces of the microchips 14A and 14B. By doing this, only the intended connections, such as the wirebond 24C, provide the means for electrical communication between the microchips 14A and 14B.

To those ends, the spacer 20 preferably takes up enough area of the die paddle 18 to ensure that no portion of either microchip 14A or 14B contacts the paddle 18. In other words, as shown in FIG. 3, the X and Y dimensions of the spacer 20 exceed the corresponding X and Y dimensions of the microchips 14A and 14B. Some embodiments, however, do not use a single spacer 20. Instead, such embodiments may use two or more spacers 20. For example, the first microchip 14A may have a spacer 20 with X and Y dimensions that slightly exceed its X and Y dimensions, while, in a corresponding manner, the second microchip 14B may have another spacer 20 with X and Y dimensions that slightly exceed its X and Y dimensions.

In embodiments having more than two microchips 14, 1) all microchips 14 can share a single spacer 20, 2) some microchips 14 can share spacers 20, while others can have their own spacers 20, 3) all microchips 14 can have their own spacers 20, or 4) some microchips 14 can have their own or a shared spacer 20 (e.g., instances 1-3 immediately above), while others may not have a spacer 20. In fact, those skilled in the art can use other permutations and thus, the permutations discussed above are illustrative and not intended to limit various embodiments of the invention. Separate spacers 20 may be spaced from each other, or directly contact each other.

The spacer 20 may be formed from a nonconductive insulative material having a dielectric strength that is high enough to insulate against anticipated voltages for a given application. For example, in high-voltage applications, the spacer 20 may be formed from a polyimide film having a thickness of up to 0.0003 inches. In some embodiments, the spacer 20 has a thickness of between 1-2 mils. Dielectric strengths of between about 3 KV/thousandths of an inch and 6 KV/thousandths of an inch should suffice for high-voltage applications. In high voltage applications arcing may occur due to large voltage differentials between microchips and the spatial relationship between the microchips. Additionally, the spacer may include adhesive on both, its top and bottom side. In such an embodiment, the adhesive would function as the die attachment and no die attachment processing step would be required. The bottom of the spacer would adhere to the paddle and the microchip could be adhered to the top of the spacer using the adhesive on the spacer.

It should be noted that discussion of specific microchips 14, such as the IC die 14A and isolation die 14B, is illustrative of specific embodiments only. Accordingly, various other embodiments may include other types of microchips. Moreover, as noted above, other types of packages may be used. In fact, some embodiments do not mount the spacer 20 on a paddle 18 or other electrically conductive portion of the package 12. For example, the spacer 20 may be mounted at least in part on plastic material within the cavity of a premolded leadframe cavity package. In such a configuration, called a chip-on-lead, no tie bars are needed to hold the paddle in position during placement of the integrated circuit dies and during wire bonding of the dies to the leads. The spacer connects directly to the leads and holds the spacer and leads in the proper spatial relationship during die mounting and wire bonding. In such a configuration, all of the leads are available for use as input/output ports.

By using a spacer that is shaped to reside on top of a paddle in a lead frame, a standard lead frame may be used even if the integrated circuit dies change in size. Generally, standard lead frames have paddle dies that are square or rectangular in shape and are sized to accommodate a wide variety of microchip sizes. Thus, a standard lead frame can be used with a variety of microchip sizes without requiring a customized lead frame or updated split paddle design. If a prior art split panel design were used and the die shape changed, a new lead frame would need to be designed to accommodate the new chip size. Thus, either a customized mask or stamp would be necessary.

Standard assembly fixtures (e.g. wirebonding, clamps) and assembly tools may be used with embodiments of the present invention in order to create a multiple die lead frame packaged circuit. Thus, assembly tools for single integrated circuit dies may be employed for multiple die packaged circuits without modification. So long as the microchips can physically fit on the paddle die with sufficient spacing in combination with a proper insulated encapsulation material to prevent arcing due to voltage potentials, any number of microchips (e.g. dies) may be placed on the paddle die. The paddle die can be held down by the standard assembly tool and the assembly tool can then execute the required assembly process such as wire bonding between the microchips and the leads.

An additional benefit of embodiments of the present invention over split paddle designs includes the ability to use all of the leads for input and output. The greater the number of microchips that are used in a packaged circuit, the more crucial the leads become for input/output communications. In prior art split paddle designs, some of the leads are used for paddle support during assembly (i.e. the leads are used as support in place of traditional paddle tie bars) and therefore, the leads can not be used as input or output pins. In present embodiments of the invention, all of the leads can be used for input/output communications, since the die paddle can be secured using two tie bars without using the leads for support.

Figure 4:
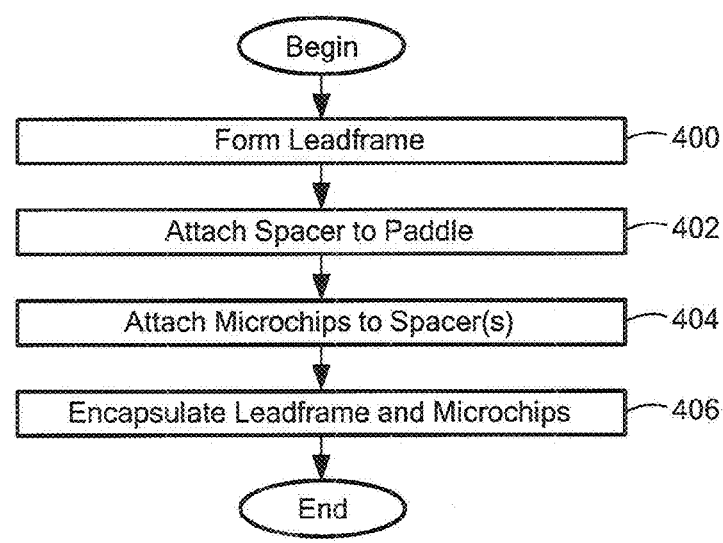
FIG. 4 shows a process of forming a packaged microchip in accordance with illustrative embodiments of the invention.

FIG. 4 shows a process of forming the packaged microchip 10 shown in FIGS. 1-3 in accordance with illustrative embodiments of the invention. It should be noted that this process this simplified and thus, omits certain steps that those skilled in the art may use.

The process begins at step 400 by forming the leadframe. Specifically, as known by those skilled in the art, conventional etching processes may form a leadframe to have the necessary structure for mounting the spacer 20 and microchips 14A and 14B. Step 400 is an optional step as the lead frame may be a standard lead frame that is pre-produced. The process continues to step 402, which attaches the spacer 20 to the die paddle 18. As noted above, conventional adhesive on the bottom face of the spacer 20 should adequately secure it to the leadframe. Some embodiments, however, may not have a die paddle 18. For example, such embodiments may simply support the dies 14A and 14B directly on the leads 16. In that case, the process attaches the spacer 20 directly to the leads 16.

Next, step 404 attaches the microchips 14A and 14B to the spacer 20 using conventional die attach material 22. In certain embodiments, the die attach material may be a polymer adhesive or epoxy. Additionally, the die attach material that couples the microchips to the spacer may be a non-conductive material. In alternative embodiments, however, rather than first attaching the spacer 20 to the paddle 18, the spacer 20 first is attached to the microchips 14A and 14B, and then secured to the die paddle 18. The process concludes at step 406 by encapsulating the leadframe, microchips 14A and 14B, spacer 20, and all other components in elastomer, such as plastic.

By substantially eliminating unintended leakage currents between microchips 14A and 14B, illustrative embodiments permit the use of a single package 12 across many different applications. For example, an application using three microchips 14 does not require a special, custom made package with three die paddles 18. Instead, such application can use a conventional stock package 12 having a single die paddle 18, thus reducing overall part cost.

Although the above discussion discloses various exemplary embodiments of the invention, it should be apparent that those skilled in the art can make various modifications that will achieve some of the advantages of the invention without departing from the true scope of the invention.

What is claimed is:

1. A packaged microchip comprising:
 a base;
 at least one spacer coupled to the base, the spacer having a substantially uniform thickness; and
 first and second microchips mounted to the at least one spacer, the spacer being configured to substantially prevent leakage current between the first and second microchips;
 wherein the spacer is an insulation layer that electrically isolates the first and second microchips from the base;
 wherein the base comprises one of a premolded leadframe package or a postmolded leadframe package
 wherein a first spacer couples with the first microchip and a second spacer couples with the second microchip.

2. The packaged microchip as defined by claim 1 wherein the first spacer is spaced from the second spacer.

3. A packaged microchip comprising:
 a base;
 at least one spacer coupled to the base, the spacer having a substantially uniform thickness;

first and second microchips mounted to the at least one spacer, the spacer being configured to substantially prevent leakage current between the first and second microchips;

wherein the spacer is an insulation layer that electrically isolates the first and second microchips from the base;

wherein the base comprises one of a premolded leadframe package or a postmolded leadframe package; and a first electrical interface and a second electrical interface, the first electrical interface being directly electrically connected with the first microchip, the second electrical interface being directly electrically connected with the second microchip, the first microchip being directly electrically connect with the second microchip, the second microchip electrically isolating the first interface from the second interface.

4. The packaged microchip as defined by claim 3 wherein the second microchip comprises an electrical isolation device.

5. The packaged microchip as defined by claim 3 wherein the at least one spacer comprises a polyimide.

6. The packaged microchip as defined by claim 3 wherein the spacer is a polyimide tape.

7. The packaged microchip as defined by claim 3, further comprising:
an encapsulant for encapsulating a portion of the lead frame, the spacer, and the two microchips.

8. A packaged microchip comprising:
a base;
at least one spacer coupled to the base, the spacer having a substantially uniform thickness; and
first and second microchips mounted to the at least one spacer, the spacer being configured to substantially prevent leakage current between the first and second microchips;
wherein the spacer is an insulation layer that electrically isolates the first and second microchips from the base;
wherein the base comprises one of a premolded leadframe package or a postmolded leadframe package
wherein the at least one spacer comprises a dielectric having a thickness of less than about 0.003 inches.

9. A packaged microchip comprising:
a base;
at least one spacer coupled to the base, the spacer having a substantially uniform thickness; and
first and second microchips mounted to the at least one spacer, the spacer being configured to substantially prevent leakage current between the first and second microchips;
wherein the spacer is an insulation layer that electrically isolates the first and second microchips from the base;
wherein the base comprises one of a premolded leadframe package or a postmolded leadframe package
wherein the at least one spacer has a dielectric strength of between about 3 KV/thousandths of an inch to 6 KV/thousandths of an inch.

10. A packaged microchip comprising:
a base;
at least one spacer coupled to the base, the spacer having a substantially uniform thickness;
first and second microchips mounted to the at least one spacer, the spacer being configured to substantially prevent leakage current between the first and second microchips;
wherein the spacer is an insulation layer that electrically isolates the first and second microchips from the base;
wherein the base comprises a die attach paddle, the at least one spacer being coupled with the die attach paddle; and
a first electrical interface and a second electrical interface, the first electrical interface being directly electrically connected with the first microchip, the second electrical interface being directly electrically connected with the second microchip, the first microchip being directly electrically connect with the second microchip, the second microchip electrically isolating the first interface from the second interface.

11. A method for constructing a packaged microchip, the method comprising:
attaching at least one spacer to one or more paddles of a lead frame;
attaching at least a first and second microchips to the at least one spacer;
electrically connecting the first and second microchips using wire bonds; and
electrically connecting the first microchip to a first lead and the second microchip to a second lead, wherein the at least one spacer comprises a dielectric having a thickness of less than about 0.003 inches.

12. A method according to claim 11 wherein the at least one spacer includes adhesive for attachment to at least one of the paddles.

13. A method according to claim 11 wherein a first and second microchips are attached to the at least one spacer using a non-conductive die attach material.

14. A method according to claim 11 wherein the first lead is connected to the first microchip through a wire bond.

15. A method according to claim 11 wherein the first microchip is an an electrically isolating device.

16. A method according to claim 11 further comprising:
molding a package around the lead frame and first and second microchips while leaving at least a portion of the first and second leads exposed.

17. A method according to claim 11, further comprising:
attaching only two paddle tie bars to each of the one or more paddles prior to electrically connecting the wire bonds.

18. A method according to claim 11 wherein the at least one spacer comprises a polyimide.

19. The method according to claim 11 wherein the at least one spacer has a dielectric strength of between about 3 KV/thousandths of an inch to 6 KV/thousandths of an inch.

20. A method for constructing a packaged microchip, the method comprising:
attaching at least one spacer to a lead frame having at least first and second leads;
attaching at least a first and second microchip to the at least one spacer;
electrically connecting the first and second microchips using wire bonds; and
electrically connecting the first microchip to the first lead and the second microchip to the second lead, wherein the at least one spacer comprises a dielectric having a thickness of less than about 0.003 inches.

21. A method according to claim 20 wherein the at least one spacer comprises a polyimide.

22. The method according to claim 20 wherein the at least one spacer has a dielectric strength of between about 3 KV/thousandths of an inch to 6 KV/thousandths of an inch.

23. The method according to claim 11, further comprising:
creating a lead frame having at least a first and a second lead.

24. The method according to claim 20, further comprising:
creating a lead frame having at least a first and a second lead.

* * * * *

UNITED STATES PATENT AND TRADEMARK OFFICE
CERTIFICATE OF CORRECTION

| | | |
|---|---|---|
| PATENT NO. | : 8,138,593 B2 | Page 1 of 1 |
| APPLICATION NO. | : 12/255012 | |
| DATED | : March 20, 2012 | |
| INVENTOR(S) | : Angelo Pagkaliwangan et al. | |

It is certified that error appears in the above-identified patent and that said Letters Patent is hereby corrected as shown below:

In Col. 7, line 14
replace "connect"
with --connected--

In Col. 8, line 6
replace "connect"
with --connected--

Signed and Sealed this
Nineteenth Day of June, 2012

David J. Kappos
*Director of the United States Patent and Trademark Office*